US 9,502,860 B1

(12) United States Patent
Minneman

(10) Patent No.: US 9,502,860 B1
(45) Date of Patent: Nov. 22, 2016

(54) ELIMINATING UNWANTED OPTICAL OUTPUT POWER FROM A MULTI-DEVICE TUNABLE LASER BY USING A WAVELENGTH BLOCKING COMPONENT

(71) Applicant: Michael Minneman, Lafayette, CO (US)

(72) Inventor: Michael Minneman, Lafayette, CO (US)

(73) Assignee: Insight Photonic Solutions, Inc., Lafayette, CO (US)

(*) Notice: Subject to any disclaimer, the term of this patent is extended or adjusted under 35 U.S.C. 154(b) by 0 days.

(21) Appl. No.: 14/211,593

(22) Filed: Mar. 14, 2014

Related U.S. Application Data

(60) Provisional application No. 61/786,975, filed on Mar. 15, 2013.

(51) Int. Cl.
| | |
|---|---|
| *H01S 5/06* | (2006.01) |
| *H01S 5/062* | (2006.01) |
| *H01S 5/14* | (2006.01) |
| *H01S 3/10* | (2006.01) |
| *H01S 3/08* | (2006.01) |
| *H01S 3/067* | (2006.01) |
| *H01S 5/40* | (2006.01) |

(52) U.S. Cl.
CPC .............. *H01S 5/06* (2013.01); *H01S 5/06206* (2013.01); *H01S 5/141* (2013.01); *H01S 3/0675* (2013.01); *H01S 3/08009* (2013.01); *H01S 3/1003* (2013.01); *H01S 3/10023* (2013.01); *H01S 5/4012* (2013.01)

(58) Field of Classification Search
CPC .... H01S 5/06; H01S 5/06206; H01S 5/4012; H01S 3/0675; H01S 3/08009; H01S 3/0826; H01S 3/10023; H01S 3/1003; H01S 5/026; H01S 5/141
See application file for complete search history.

(56) References Cited

U.S. PATENT DOCUMENTS

| | | | | |
|---|---|---|---|---|
| 5,659,644 | A | * 8/1997 | DiGiovanni | G02B 6/4215 359/341.33 |
| 5,841,797 | A | * 11/1998 | Ventrudo | G02B 6/02076 250/225 |
| 6,480,513 | B1 | * 11/2002 | Kapany | H01S 5/146 372/102 |
| 2001/0036332 | A1 | * 11/2001 | Brennan et al. | 385/15 |
| 2003/0039015 | A1 | * 2/2003 | Vujkovic-Cvijin | H01S 3/1303 398/197 |

* cited by examiner

*Primary Examiner* — Xinning Niu
(74) *Attorney, Agent, or Firm* — Renner, Otto, Boisselle and Sklar LLP

(57) ABSTRACT

A tunable swept multi-laser system comprising a first laser source, a second laser source, a first wavelength blocking component, and a second wavelength blocking component. The first laser source has a first wavelength working range and the second laser source has a second wavelength working range. The first wavelength working range begins at a first start wavelength and ends at a first end wavelength. The second wavelength working range begins at a second start wavelength, ends at a second end wavelength, and overlaps with the first wavelength working range. The first wavelength blocking component has a first wavelength blocking range including the first end wavelength. The second wavelength blocking component has a second wavelength blocking range including the second start wavelength. The first wavelength blocking component is optically coupled with the first laser source and the second wavelength blocking component is optically coupled with the second laser source.

24 Claims, 8 Drawing Sheets

ELIMINATING UNWANTED OPTICAL OUTPUT POWER FROM A MULTI-DEVICE TUNABLE LASER BY USING A WAVELENGTH BLOCKING COMPONENT

RELATED APPLICATIONS

This application is a Non-Provisional of the U.S. Application No. 61/786,975 filed Mar. 15, 2013, which is hereby incorporated herein by reference in its entirety.

TECHNICAL FIELD

The present invention relates generally to a system and method to block the output of one or more individual undesired laser sources in a tunable swept multi-laser system to reduce the effect of the non-desired laser sources on the output of the system.

BACKGROUND

Individual tunable laser sources are often used in optical systems as tunable swept laser sources. However, because it is common for the wavelength range of a single tunable laser to be insufficiently wide for the desired performance of the system, the output of multiple tunable laser sources are often combined to achieve the proper wavelength range for the application. In such a tunable swept multi-laser system, it is desirable to have only a single laser output electromagnetic radiation into the optical system at a given time.

In simple systems, the output of multiple laser sources is combined using an optical coupler and non-desired tunable laser sources in the system are simply turned off. In practice, turning off non-desired laser sources has the consequence of increasing scanning time and/or instability of the swept laser signal. As a laser is turned on in a system, the system can either wait for the laser output to stabilize by pausing data collection or acquire individual data sets for each tunable laser sweep and, in post processing, combine the separate datasets into one combined dataset. Both of these strategies require additional time resulting in a reduced sweep speed and a slower repetition rate.

In most swept applications, there are significant performance advantages, both for speed and stability, to leaving all the separate tunable laser sources on and separating the signal by another means. One such means is an optical switch, but cost, stability and switch time can all limit the performance of the system. In other systems, a wavelength division multiplexer (WDM) may be employed, but the isolation between the optical outputs is largely determined by the isolation of the WDM, which is limited and not sufficient for many applications. Another alternative is to power off the semiconductor optical amplifier. However, the laser continues to output light when the semiconductor optical amplifier is turned off, and the leakage power may contaminate the overall spectrum of the signal.

SUMMARY

The present disclosure provides a system and method for blocking, in a tunable swept multi-laser system, the output of at least one laser using wavelength blocking components to control the spectral quality of the electromagnetic output of the tunable swept multi-laser system.

According to one aspect of the disclosure, there is provided a tunable swept multi-laser system. The system includes a first laser source having a first wavelength working range wherein the first wavelength working range begins at a first start wavelength and ends at a first end wavelength. The system also includes a second laser source having a second wavelength working range wherein the second wavelength working range begins at a second start wavelength and ends at a second end wavelength. The system further includes a first wavelength blocking component having a first wavelength blocking range, wherein the first wavelength blocking component is optically coupled with the first laser source, the first wavelength blocking range including the first end wavelength, and a second wavelength blocking component having a second wavelength blocking range, wherein the second wavelength blocking component is optically coupled with the second laser source, the second wavelength blocking range including the second start wavelength. There is an overlap between the first wavelength working range and the second wavelength working range.

According to one feature the system further includes a coupler having a first optical input, a second optical input, and an optical output. The first optical input is coupled with the first laser source, the second optical input is coupled with the second laser source, and the optical output is configured to emit the combined output of the first laser source and the second laser source.

According to one feature the first start wavelength is smaller than the second start wavelength and the first end wavelength is smaller than the second end wavelength.

According to one feature the first end wavelength blocking range is a slightly lower wavelength than the second wavelength start blocking range.

According to one feature the system further includes a start wavelength blocking component optically coupled with the first laser source and having an ending blocking range, the end wavelength blocking range including the first end wavelength, and a start wavelength blocking component optically coupled with the second laser source and having a start wavelength blocking range, the start wavelength blocking range including the second start wavelength.

According to one feature the first laser source and the second laser source are Semiconductor Monolithic Tunable Laser sources.

According to one feature the first wavelength blocking component and the second wavelength blocking component are Fiber Bragg Gratings.

According to one feature the system further includes a controller. The controller is configured to set and hold the output wavelength of the second laser source to the second start wavelength and within the blocking range, control the output wavelength of the first laser source such that the output of the first laser source is swept from the first start wavelength to the first end wavelength, hold the output wavelength of the first laser source to the first end wavelength within the first wavelength blocking range, and control the output wavelength of the second laser source such that the output of the second laser source is swept from the second start wavelength to the second end wavelength.

According to one feature the system further includes a controller. The controller is configured to control the output wavelength of the first and second laser source, wherein the controller directs both the first and second laser source to output light having an output wavelength approximately equal to a specified wavelength, the first laser source configured such that, when it is directed to output the specified wavelength, the output wavelength of the first laser source output is approximately equal to the first start wavelength when the specified wavelength is less than the first start wavelength, the first end wavelength when the specified wavelength is greater than the first end wavelength; and the specified wavelength when the specified wavelength is within the first wavelength working range, the second laser source configured such that, when it is directed to output the specified wavelength, the output wavelength of the second laser source output is approximately equal to the second start wavelength when the specified wavelength is less than the second start wavelength, the second end wavelength when the specified wavelength is greater than the second end wavelength, the specified wavelength when the specified wavelength is within the second wavelength working range.

According to one feature the controller sweeps the specified wavelength from the first start wavelength to the second end wavelength.

According to one feature the system further includes a controller. The controller is configured to control the light output by the first laser source and the second laser source to generate a multi-laser swept signal. The first and/or second laser source outputs light having a wavelength approximately equal to a directed wavelength at each time point in the multi-laser swept signal to generate the multi-laser swept signal. The controller sweeps a specified wavelength from the first start wavelength to the second end wavelength to generate the multi-laser swept signal, such that when the specified wavelength is within the first wavelength working range, the controller directs the first laser source to output light having an output wavelength approximately equal to the specified wavelength, when the specified wavelength is within the second wavelength working range, the controller directs the second laser source to output light having an output wavelength approximately equal to the specified wavelength, when the specified wavelength is less than the first start wavelength, the controller directs the first laser source to output light having an output wavelength approximately equal to the first start wavelength, when the specified wavelength is greater than the first end wavelength, the controller directs the first laser source to output light having an output wavelength approximately equal to the first end wavelength, when the specified wavelength is less than the second start wavelength, the controller directs the second laser source to output light having an output wavelength approximately equal to the second start wavelength, when the specified wavelength is greater than the second end wavelength, the controller directs the second laser source to output light having an output wavelength approximately equal to the second end wavelength.

According to another aspect of the disclosure, there is provided a tunable swept multi-laser system. The system includes multiple laser sources including a first laser source, a last laser source, and other laser sources, each laser source having a wavelength working range, the wavelength working range beginning at a start wavelength and ending at an end wavelength, wherein each laser source outputs light having a wavelength in the wavelength working range. The system also includes multiple wavelength blocking components including a first wavelength blocking component and a last wavelength blocking component, each wavelength blocking component optically coupled to an associated laser source and having a wavelength blocking range and the first laser source optically coupled to the first wavelength blocking component. The wavelength blocking range of the first wavelength blocking component includes the end wavelength of the first laser source. The last laser source is optically coupled to the last wavelength blocking component. The wavelength blocking range of the last wavelength blocking component includes the start wavelength of the last laser source. Each other laser source is optically coupled to two wavelength blocking components, each two wavelength blocking components including a start wavelength blocking component and an ending wavelength blocking component, each start wavelength blocking component having a wavelength blocking range including the start wavelength of the associated laser source, each ending wavelength blocking component having a wavelength blocking range including the end wavelength of the associated laser source. The wavelength working range of the first laser source overlaps the wavelength working range of one of the multiple laser sources. The system further includes the wavelength working range of the last laser source overlapping the wavelength working range of one of the multiple laser sources and the wavelength working range of each other laser source overlapping the wavelength working range of two of the multiple laser sources.

According to one feature the system further includes a coupler having multiple optical inputs and an optical output. The optical inputs are configured to optically couple with the multiple laser sources and the optical output is configured to emit the combined output of the multiple laser sources.

According to one feature the coupler comprises multiple couplers optically coupled to one another.

According to one feature the wavelength working ranges of the multiple laser sources overlap to form a combined wavelength working range having a combined start wavelength and a combined end wavelength.

According to one feature the wavelength blocking range of two of the wavelength blocking components are encompassed by each overlap of the wavelength working ranges of the multiple laser sources.

According to one feature the wavelength blocking range of the two of the wavelength blocking component encompassed by each overlap of the wavelength working range are approximately contiguous.

According to one feature the multiple laser sources are Semiconductor Monolithic Tunable Laser sources.

According to one feature the wavelength blocking components are Fiber Bragg Gratings.

According to another aspect of the disclosure, there is provided a method for blocking, in a tunable swept multi-laser system including multiple laser sources wherein each laser is associated with at least one wavelength blocking component and each wavelength blocking component has a wavelength blocking range, the output of at least one laser source using the at least one associated wavelength blocking component to control the output of the tunable swept multi-laser system, wherein each laser source has a wavelength working range defined by a start wavelength and an end wavelength. The method includes selecting a desired laser source and setting the other laser sources as undesired laser sources, tuning each undesired laser source to its start wavelength, sweeping the desired laser source across its working range, parking the desired laser source at its end wavelength, setting the desired laser source as a previously desired laser source, repeatedly setting one of the undesired laser sources as the desired laser source, sweeping the desired laser source across its working range parking the desired laser source at its end wavelength, and setting the desired laser source as a previously desired laser source until there are no remaining undesired laser sources.

According to one feature a laser order specifying an order of the laser sources is received prior to selecting the desired laser source and laser sources are selected as the desired laser source in the order specified in the laser order.

According to one feature a laser order specifying an order of the laser sources is determined prior to selecting the desired laser source and laser sources are selected as the desired laser source in the order specified in the laser order.

According to one feature the laser order is determined such that the laser sources are ordered by start wavelength from the lowest start wavelength to the highest start wavelength.

According to another aspect of the disclosure, there is provided a method for blocking, in a tunable swept multi-laser system including multiple laser sources wherein each laser is associated with at least one wavelength blocking component and each wavelength blocking component has a wavelength blocking range, the output of at least one laser source using the at least one associated wavelength blocking component to control the output of the tunable swept multi-laser system, wherein each laser source has a wavelength working range defined by a start wavelength and an end wavelength. The method includes determining or receiving a start wavelength and an end wavelength of a multi-laser wavelength working range and sweeping the multiple lasers of the tunable swept multi-laser system across the multi-laser wavelength working range.

According to another aspect of the disclosure, there is provided a controller for performing the above-described method.

A number of features are described herein with respect to embodiments of the invention; it will be appreciated that features described with respect to a given embodiment also may be employed in connection with other embodiments.

The invention includes the features described herein, including the description, the annexed drawings, and, if appended, the claims, which set forth in detail certain illustrative embodiments. These embodiments are indicative, however, of but a few of the various ways in which the principles of the invention may be employed.

DETAILED DESCRIPTION

The present disclosure provides a system and method for blocking the output of undesired laser sources in a tunable swept multi-laser system. A tunable swept multi-laser system may combine the output from multiple laser sources in order to achieve a multi-laser swept signal having a wavelength range broader than the wavelength range of any single laser in the system. In order to improve the multi-laser spectral quality of the swept signal, the output of all but a desired laser is blocked using wavelength blocking components.

Figure 1:
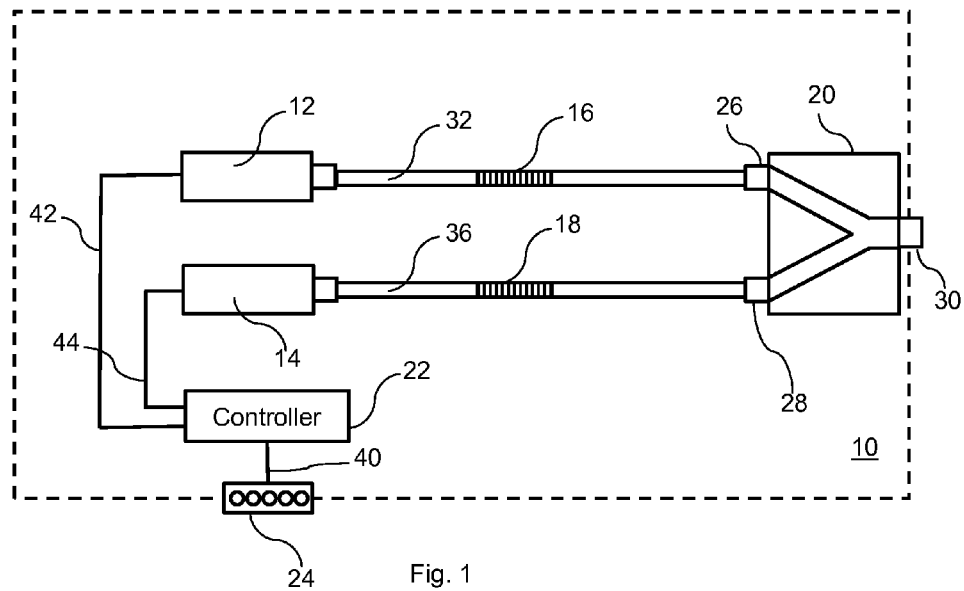
FIG. 1 is a representation of an exemplary tunable swept multi-laser system.

An exemplary tunable swept multi-laser system 10 in accordance with aspects of the present disclosure is illustrated in FIG. 1. The system 10 includes a first laser source 12, a second laser source 14, a first wavelength blocking component 16, a second wavelength blocking component 18, a coupler 20, and a controller 22. The first laser source 12 may be coupled to a first optical input 26 of the coupler 20 by a first optical fiber 32. The second laser source 14 may be coupled to a second optical input 28 of the coupler 20 by a second optical fiber 36. The controller 22 may control operation of the laser sources 12, 14 in order to generate a multi-laser swept signal through an output 30 of the coupler 20. The multi-laser wavelength range $\lambda_{rangeML}$ may be a combination of the wavelength ranges of the individual laser sources 12, 14 in the system 10. The wavelength range $\lambda_{rangeML}$ of the multi-laser swept signal may be a combination, part, or entirety of the visible light range, ultraviolet range, infrared range, or any other suitable range of wavelengths. One of ordinary skill in the art will readily appreciate that the wavelength range $\lambda_{rangeML}$ of the multi-laser swept signal may comprise other wavelengths and wavelength ranges.

The laser sources 12, 14 are swept laser sources. The sweep of the laser sources 12, 14 may be sufficiently fast to allow a detector to examine the power versus wavelength spectrum of light in a time frame that is in the second to nanosecond (ns) range. The laser sources 12, 14 may be, as will be understood by one of ordinary skill in the art, a Semiconductor Monolithic Tunable Laser Source (SMTLS) or any other suitable type of tunable laser source. For convenience, the electromagnetic radiation emitted by the laser sources 12, 14 will be referred to as light or a light beam, although other forms of electromagnetic radiation are contemplated.

The term "swept" or "sweep", as used herein, refers to the laser sources 12, 14 outputting a wavelength of light at one time point. The term wavelength, as used herein, may be used to refer to a discrete wavelength or range of wavelengths. The wavelength output by the laser source is changed as time progresses from one wavelength to another wavelength. The wavelength output by the laser source is changed over time to encompass a range of wavelengths. The wavelength sweep over a range of wavelengths does not require that the sweep include all wavelengths in the range of wavelengths.

Figure 2A:
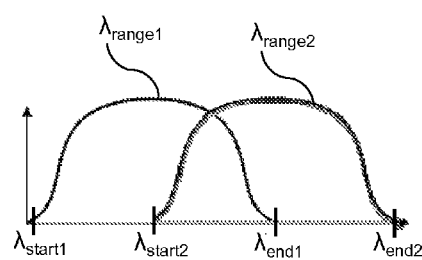
FIG. 2A illustrates an exemplary wavelength working range of two laser sources in the system of FIG. 1.

An exemplary wavelength sweep is shown in FIG. 2A. In FIG. 2A, the first laser source 12 output is swept across a wavelength working range $\lambda_{range1}$ that is different from the wavelength working range $\lambda_{range2}$ of light output by the second laser source 14. The first wavelength working range $\lambda_{range1}$ and second wavelength working range $\lambda_{range2}$ may overlap as depicted in FIG. 2, such that, e.g., an end wavelength $\lambda_{end1}$ of the first wavelength working range $\lambda_1$ may be greater than a start wavelength $\lambda_{start2}$ of the second wavelength working range $\lambda_{range2}$.

The first laser source 12 may be optically coupled to a first wavelength blocking component 16 via the first optical fiber 32. Similarly, the second laser source 14 may be optically coupled to a second wavelength blocking component 18 via the second optical fiber 36. The wavelength blocking components 16, 18 may be separate physical components from the optical fibers 32, 36 or the wavelength blocking components 16, 18 may be an integral part of the optical fibers 32, 36.

Figures 2B, 2C, 2D:
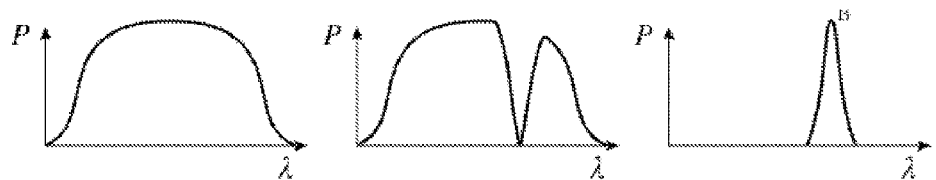
FIGS. 2B-2D illustrate an exemplary relationship between a wavelength working range and a wavelength blocking range.

The wavelength blocking components 16, 18 block light signals at a specific wavelength. The term "block", as used herein, refers to, e.g., attenuation, absorption and/or reflection of light. FIGS. 2B-2D depict the treatment of an exemplary signal input into an exemplary wavelength blocking component. The signal depicted in FIG. 2B is transmitted through an exemplary wavelength blocking component, which results in a portion of the signal at a blocking wavelength $\lambda_B$ being blocked. As a result the signal shown in FIG. 2C is transmitted through the exemplary wavelength blocking component. The signal component at the blocking wavelength $\lambda_B$ may be reflected by the wavelength blocking component as shown in FIG. 2D. As will be understood by one of ordinary skill in the art, while wavelength blocking components are described as blocking signals at a blocking wavelength, the wavelength blocking components may also block signals in a range of wavelengths around a blocking wavelength $\lambda_B$.

The wavelength blocking components 16, 18 may be Fiber Bragg Gratings (FBG). A FBG is a type of distributed Bragg reflector constructed in a short segment of optical fiber that reflects particular wavelengths of light and transmits other wavelengths. An FBG is generated by creating a periodic variation in the refractive index of a fiber core of an optical fiber, which generates a wavelength specific dielectric mirror. A FBG may be used as an inline optical filter to block certain wavelengths or as a wavelength-specific reflector. As will be understood by one of ordinary skill in the art, the wavelength blocking components 16, 18 may be any suitable component capable of blocking a specific wavelength or range of wavelengths.

The controller 22 may control operation of the laser sources 12, 14. The controller 22 may control the wavelength of light output by each laser source 12, 14 at a given time. For example, the controller may control sweeping of the laser sources 12, 14 across their respective wavelength working ranges. The controller 22 may be communicatively connected with the first laser source 12 by connection 42 and the second laser sources 14 by connection 44. As will be understood by one of ordinary skill in the art, the controller 22 may have various implementations. For example, the controller may be separate from the laser sources 12, 14 or a part of the laser sources 12, 14. The controller may include a processor or any other suitable device, such as a programmable circuit, integrated circuit, memory and I/O circuits, an application specific integrated circuit, microcontroller, complex programmable logic device, other programmable circuits, or the like. The controller may also include a non-transitory computer readable medium, such as random access memory (RAM), a read-only memory (ROM), an erasable programmable read-only memory (EPROM or Flash memory), or any other suitable medium. Instructions for performing the method described below may be stored in the non-transitory computer readable medium and executed by the processor.

The light output by the laser sources 12, 14 may be combined and output from the tunable swept multi-laser system 10 by the coupler 20. As will be understood by one of ordinary skill in the art, the coupler 20 may be a passive optical component capable of combining or splitting transmission data (e.g., optical power) from optical fibers. The coupler might include one or more optical inputs and one or more optical outputs. In addition, the coupler 20 may take the form of a combination of multiple couplers and/or optical components.

The system may additionally include a system port 24 for connecting to the controller 22. The controller 30 may be communicatively connected through a connection 40 to the system port 24. As will be understood by one or ordinary skill in the art, the system port 24 may be a USB, Serial ATA, Bluetooth, Ethernet, Firewire, or any other suitable connector.

Figure 3A:
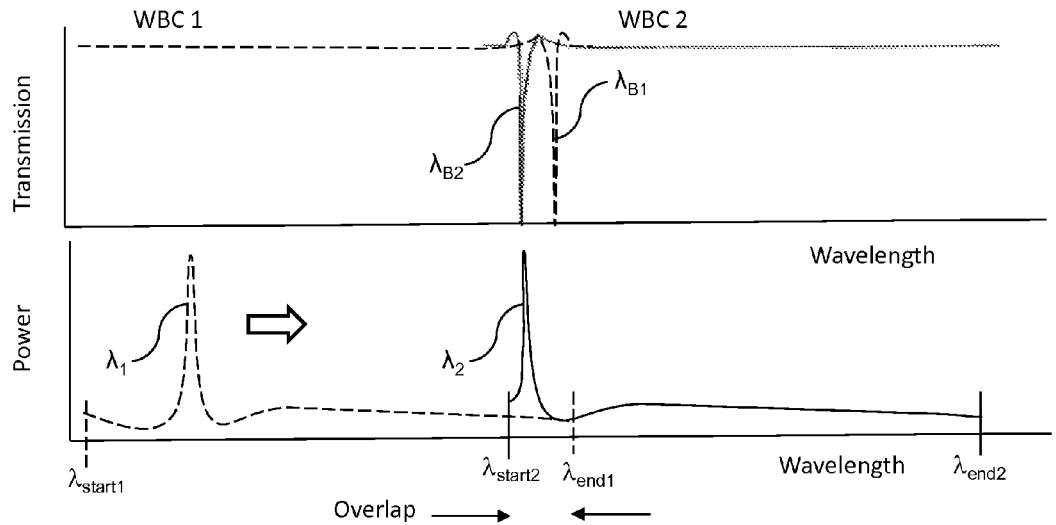
FIGS. 3A and 3B illustrate an exemplary wavelength blocking range for a first and second wavelength blocking component and an exemplary wavelength working range for a first and second laser source.
Figure 3B:
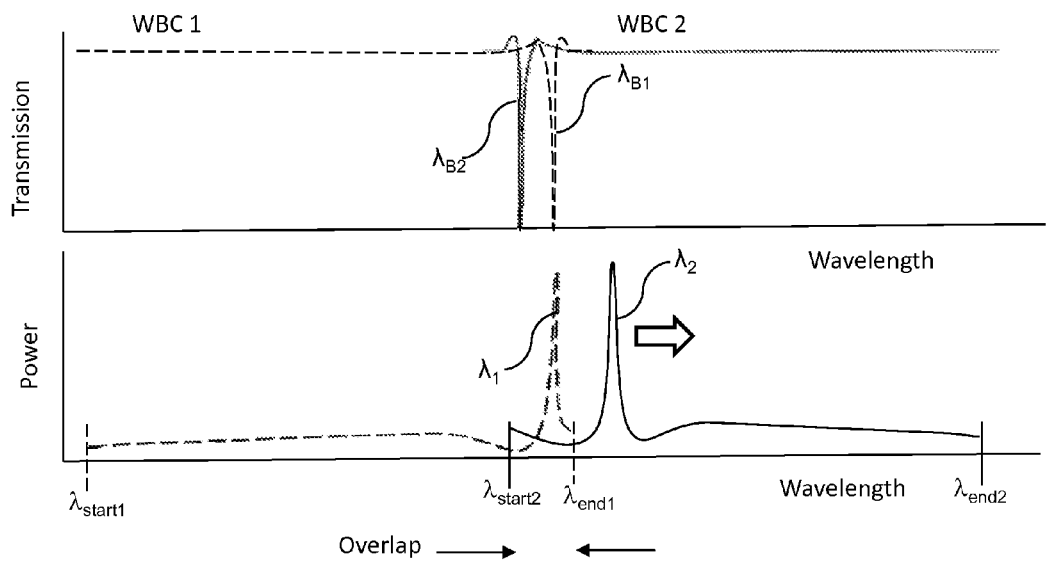

Referring to FIGS. 3A and 3B, the first laser source 12 is configured to emit light with a wavelength in a first wavelength working range $\lambda_{range1}$ that is defined by a first start wavelength $\lambda_{start1}$ and a first end wavelength $\lambda_{end1}$. The second laser source 14 is configured to emit light with a wavelength in a second wavelength working range $\lambda_{range2}$ that is defined by a second start wavelength $\lambda_{start2}$ and a second end wavelength $\lambda_{end2}$. The first end wavelength $\lambda_{end1}$ may be larger than the second start wavelength $\lambda_{start2}$, such that there is an overlap between the first wavelength working range $\lambda_{range1}$ and the second wavelength working range $\lambda_{range2}$ as depicted in FIG. 3A.

In FIGS. 3A and 3B, the transmission of light through the wavelength blocking components at different wavelengths is depicted at the top of the figures and the wavelength of light output by the laser sources 12, 14 is depicted at the bottom of the figures. The sharp decrease in transmission of the wavelength blocking components represent the wavelength blocking range of the different wavelength blocking components. The first wavelength blocking component 16 is configured to block light at a first wavelength blocking range $\lambda_{B1}$. The second wavelength blocking component 18 is configured to block light at a second wavelength blocking range $\lambda_{B2}$. As depicted in the figures, the first wavelength blocking range $\lambda_{B1}$ may include the first end wavelength $\lambda_{end1}$ and the second wavelength blocking range $\lambda_{B2}$ may include the second start wavelength $\lambda_{start2}$. The wavelengths of the first wavelength blocking range $\lambda_{range1}$ may be larger than the wavelengths of the second wavelength blocking range $\lambda_{range2}$. The first wavelength blocking range $\lambda_{B1}$ and the second wavelength blocking range $\lambda_{B2}$ may be contiguous.

The controller 22 may be configured such that when controlling the laser sources 12, 14 to generate a multi-laser swept signal, the controller directs both laser sources to output light at the same specified wavelength in the multi-laser swept signal. The laser sources 12, 14 may be configured such that when the controller 22 directs a laser source 12, 14 to output light at the specified wavelength, and the specified wavelength is smaller than the start wavelength of the laser source 12, 14, the laser source 12, 14 emits light at its start wavelength. Similarly, if the specified wavelength is larger than the end wavelength of the laser source 12, 14, the laser source 12, 14 may emit light at its end wavelength. If the specified wavelength is within the wavelength working range of the laser source, the laser source may emit light at the specified wavelength. The term "emit light at a given wavelength", as used herein, refers to a laser source emitting light at a wavelength approximately equal to the given wavelength or in a range of wavelengths approximately including the given wavelength.

Alternatively, the controller 22 may be configured such that when controlling the laser sources 12, 14 to generate a multi-laser swept signal, the controller only directs the laser sources to output light at a wavelength in their wavelength working range. For example, when the specified wavelength in the multi-laser swept signal is less than the starting wavelength of a laser source, the controller directs the laser source to output light at the start wavelength. Similarly, when the specified wavelength in the multi-laser swept signal is greater than the end wavelength, the controller directs the laser source to output light at the end wavelength. If the specified wavelength is within the wavelength working range of the laser source, the controller may direct the laser source to output light at the specified wavelength.

Figure 4:
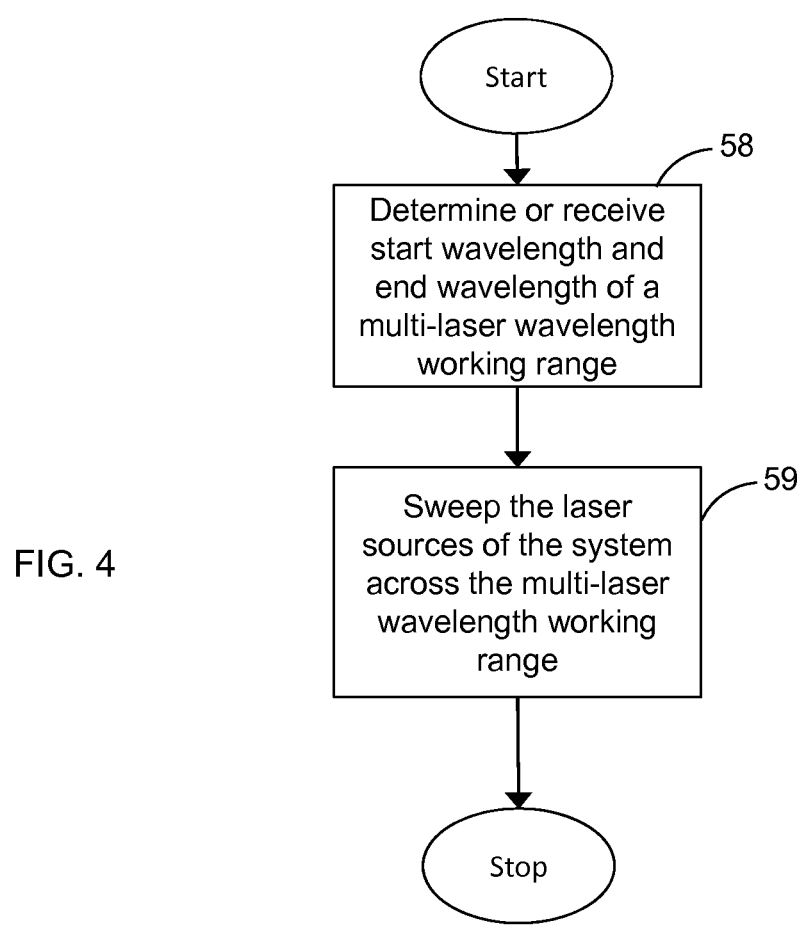
FIGS. 4 and 5 are block diagrams illustrating methods for generating a multi-laser swept signal.

With reference to FIG. 4, a block diagram depicting a method for blocking the output of undesired laser sources in a tunable swept multi-laser system is shown. The method is described with exemplary reference to FIGS. 3A and 3B and may be performed by the controller 22.

In process block 58, the controller determines or receives a starting wavelength $\lambda_{startML}$ and an end wavelength $\lambda_{endML}$ of a wavelength working range $\lambda_{rangeML}$ for the multi-laser swept signal. The controller may receive the start wavelength $\lambda_{startML}$ and the end wavelength $\lambda_{endML}$ from a user, computer, or in any other suitable manner. Alternatively, the controller may determine the start wavelength $\lambda_{startML}$ and end wavelength $\lambda_{endML}$ based on a previously entered start wavelength and end wavelength, a default setting, the known wavelength working range of the laser sources in the system, or in any other suitable manner.

In process block 59, the controller sweeps the laser sources 12, 14 of the tunable swept multi-laser system 10 across the wavelength working range $\lambda_{rangeML}$. For example, in FIG. 3A the controller sweeps the first laser source 12 across the first wavelength working range $\lambda_{range1}$ followed by sweeping the second laser source 14 across the second wavelength working range $\lambda_{range2}$ in FIG. 3B.

In FIG. 3A, while the controller is sweeping the tunable swept multi-laser system 10 between the first start wavelength $\lambda_{start1}$ and the second start wavelength $\lambda_{start2}$, the first laser source 12 is being swept between the first start wavelength $\lambda_{start1}$ and the first end wavelength $\lambda_{end1}$ and the second laser source 14 is parked at the second start wavelength $\lambda_{start2}$. The term "parked", as used herein, refers to causing a laser source to output light at a fixed wavelength or a fixed range of wavelengths and holding the laser source output at the fixed wavelength or fixed range of wavelengths. At the second start wavelength $\lambda_{start2}$, the output of the second laser source 14 is blocked by the second wavelength blocking component 18. In FIG. 3B, when the controller sweeps the tunable swept multi-laser system 10 at a specified wavelength greater than the second start wavelength $\lambda_{start2}$, the second laser source 14 outputs light having a wavelength at the specified wavelength and is no longer blocked by the second wavelength blocking component 18. At the same time, the output of the first laser source 12 reaches the first end wavelength and is blocked by the first wavelength blocking component 16. As the specified wavelength continues to increase, the first laser source 12 remains parked at the first end wavelength. While the controller is sweeping the tunable swept multi-laser system 10 between the second start wavelength $\lambda_{start2}$ and the second end wavelength $\lambda_{end2}$, the second laser source 14 is being swept between the second start wavelength $\lambda_{start2}$ and the second end wavelength $\lambda_{end2}$ and the first laser source 12 is parked at the first end wavelength $\lambda_{end1}$.

Figure 5:
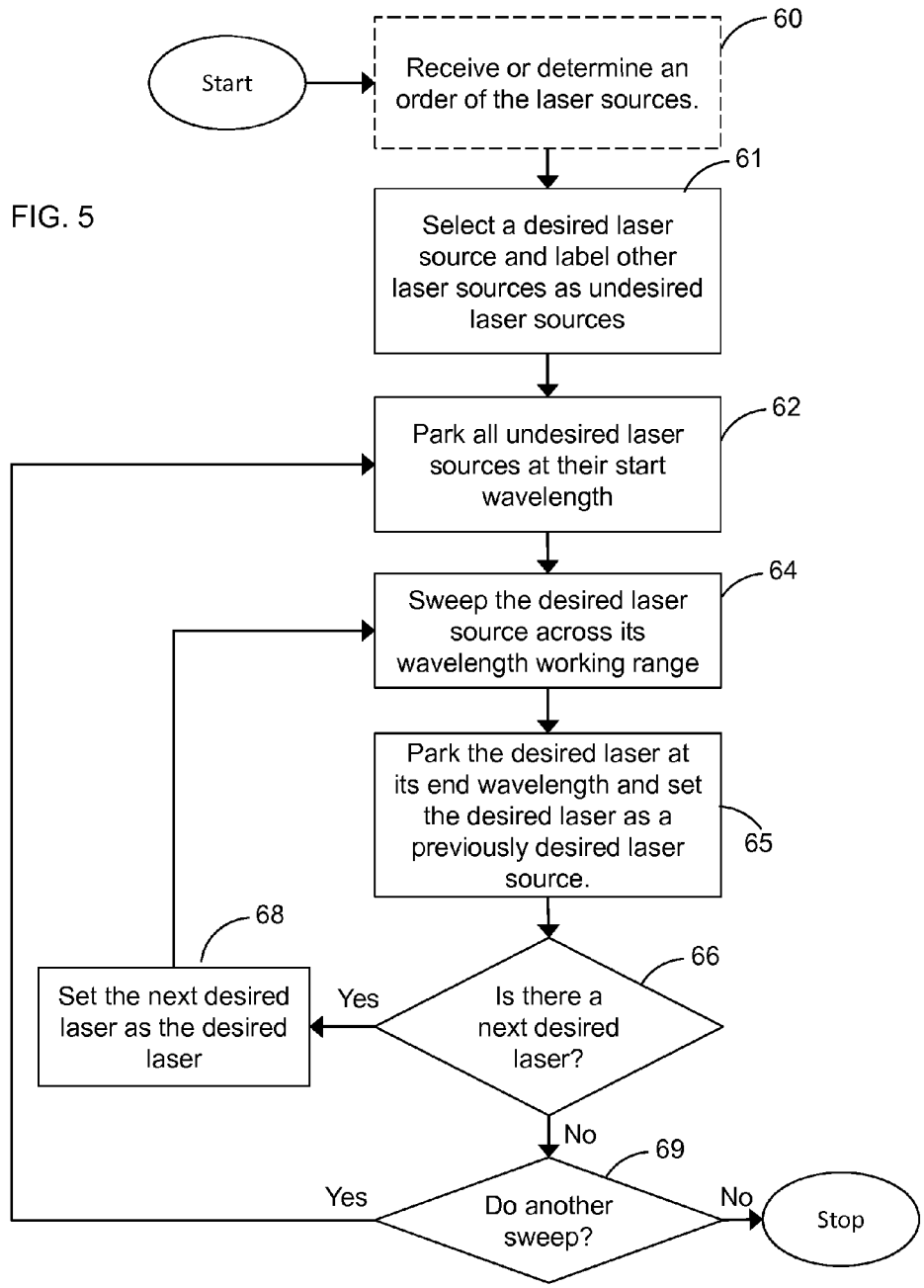

With reference to FIG. 5, a block diagram depicting an alternative method for blocking the output of undesired laser sources in a tunable swept multi-laser system is shown. The method is described with exemplary reference to FIGS. 3A and 3B and may be performed by the controller 22.

In process block 60, an order of the laser sources is optionally received or determined. The order may be used to determine the desired laser source. In FIGS. 3A and 3B the laser sources are ordered with the first laser source followed by the second laser source. In process block 61, a desired laser source is selected and the other laser sources are labeled as undesired laser sources. In FIGS. 3A and 3B, e.g., the first laser 12 is selected as the desired laser source and the second laser 14 is labeled as an undesired laser source. Next, in process block 62, all undesired laser sources are parked at a wavelength blocked by a wavelength blocking component associated with each undesired laser source. "Associated" refers to a wavelength blocking component optically coupled to a laser or otherwise receiving the output from the laser source. In FIG. 3A, e.g., the second laser 14 is parked at a wavelength $\lambda_{B2}$ blocked by the second wavelength blocking component 18.

In process block 64, the desired laser is swept across its wavelength range until reaching the wavelength blocking range of the associated wavelength blocking component, where the end wavelength of the laser source is included in the wavelength blocking range. In FIG. 3A, e.g., the wavelength $\lambda_1$ output by the first laser 12 is swept across its wavelength working range $\lambda_{range1}$ from the start wavelength $\lambda_{start1}$ to the end wavelength $\lambda_{end1}$. The end wavelength $\lambda_{end1}$ is included in the wavelength blocking range $\lambda_{B1}$ of the first wavelength blocking component 16 that is optically coupled to the first laser 12. In process block 65, the desired laser is parked at its end wavelength and set as a previously desired laser source.

In decision block 66, a determination is made if there is a next desired laser. This determination may be made by working through a laser order that places the laser sources in the system 10 in an order. For example, the laser sources may be organized in the laser order in order of start wavelength, from lowest start wavelength to highest start wavelength. When ordered, the wavelength range of the first laser source in the order may overlap with the wavelength range of the second laser source in the order, the wavelength range of the second laser source in the order may overlap with the wavelength range of a third laser source in the order, etc. Alternatively, as will be understood by one of ordinary skill in the art, the laser sources may be ordered from highest end wavelength to the lowest end wavelength or in any other suitable order. Determining if there is a next desired laser may involve determining if there is a next laser in the order. Alternatively, determining if there is a next desired laser may involve determining if there is a laser source that has not been selected. For example, as described in process block 65, after a desired laser source has been swept across its wavelength working range, the desired laser can be labeled as a previously desired laser source such that the undesired laser source list represents the laser sources that have not been selected. In FIG. 3A, e.g., the second laser source 14 is the next desired laser.

In process block 68 the next desired laser source is set as the desired laser source. For example, in FIG. 3B, the second laser source 14 is set as the desired laser. Process block 64 is then repeated with the second laser 14 set as the desired laser. In FIG. 3B the wavelength $\lambda_2$ output by the second laser 14 is swept across its wavelength working range $\lambda_{range2}$ from $\lambda_{start2}$ to $\lambda_{end2}$. In decision block 66 there is not a next desired laser and the flow diagram ends.

If there is not a next desired laser, in determining block 69, a check is performed to determine if another sweep is to be performed. If another sweep is to be performed, the method continues to process block 62.

Figure 6:
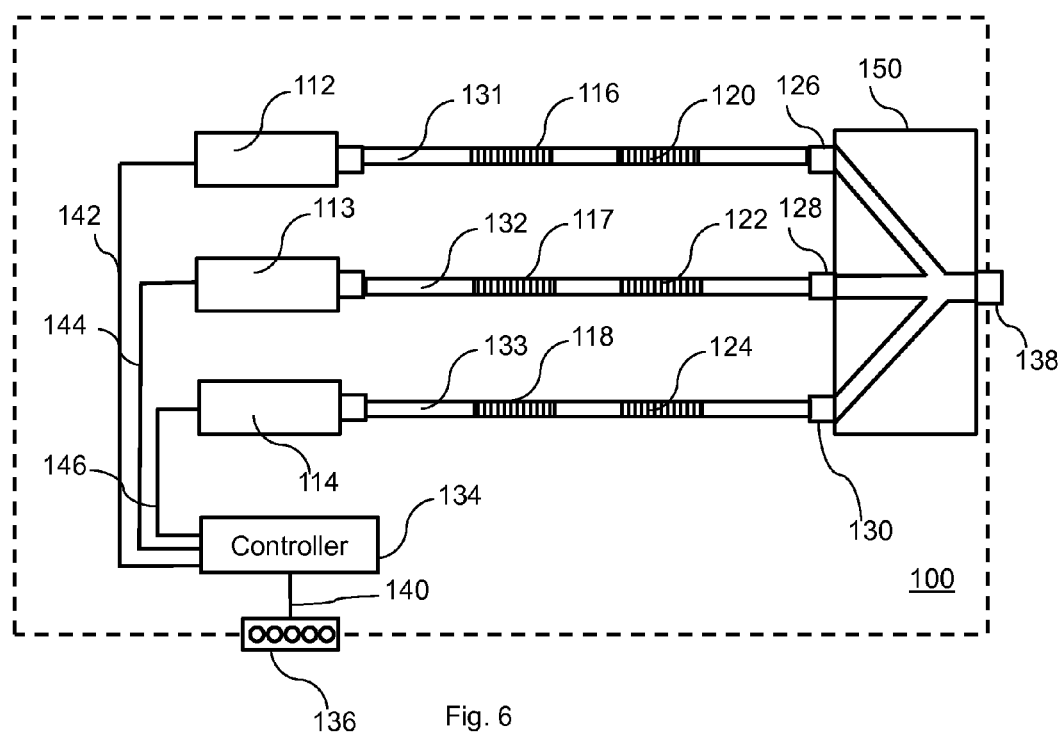
FIG. 6 is a representation of an exemplary alternative tunable swept multi-laser system.

Referring to FIG. 6, another tunable swept multi-laser system 100 is illustrated. The system 100 of FIG. 6 is similar to the system 10 previously described in FIG. 1. Other than the differences between the systems 10, 100, the system 100 of FIG. 6 will not be described in greater detail.

The system 100 includes a first laser source 112, a second laser source 113, and a third laser source 114, a first wavelength blocking component 116, a second wavelength blocking component 120, a third wavelength blocking component 117, a fourth wavelength blocking component 122, a fifth wavelength blocking component 118, a sixth wavelength blocking component 124, a coupler 150, and a controller 134. The system may also include a system port 136. The first laser source 112 may be optically coupled to a first optical input 126 of the coupler 150 by a first optical fiber 131. The second laser source 113 may be optically coupled to a second optical input 128 of the coupler 150 by a second optical fiber 132. The third laser source 114 may be optically coupled with a third optical input 130 of the coupler 150 by a third optical fiber 133. The controller 134 may control operation of the laser sources 112, 113, 114 in order to generate a multi-laser swept signal through an output 138 of the coupler 150.

The first laser source 112 may be optically coupled to a first wavelength blocking component 116 and a second wavelength blocking component 120 via the first optical fiber 131. Similarly, the second laser source 113 may be optically coupled to a third wavelength blocking component 117 and a fourth wavelength blocking component 122 via the second optical fiber 132. Additionally, the third laser source 114 may be optically coupled to a fifth wavelength blocking component 118 and sixth wavelength blocking component 124 via the third optical fiber 133. The wavelength blocking components 116, 117, 118, 120, 122, 124 may be separate physical components from the optical fibers 131, 132, 133 or the wavelength blocking components 116, 117, 118, 120, 122, 124 may be an integral part of the optical fibers 131, 132, 133.

Figure 7A:
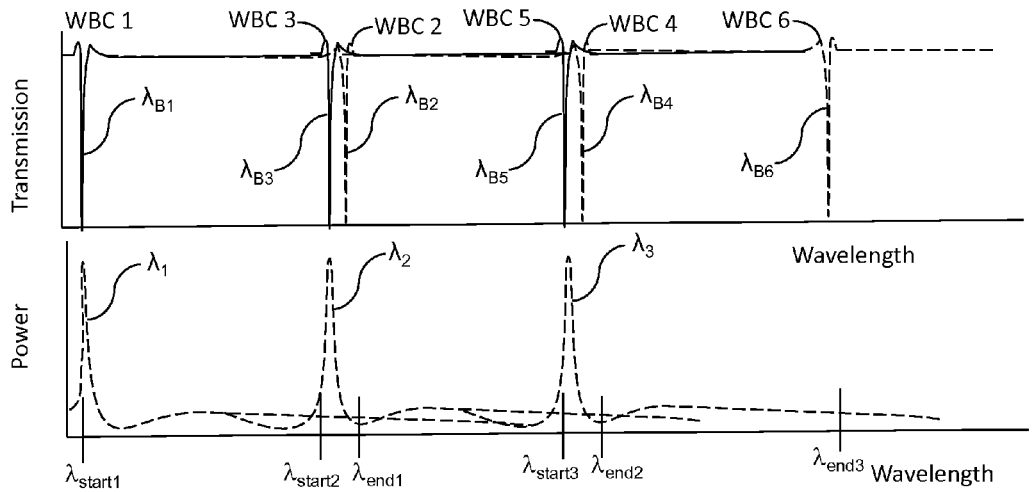
FIGS. 7A-7E illustrate the operation of an exemplary tunable swept multi-laser system.

Referring to FIGS. 7A-7E, the first laser source 112 is configured to emit light at a first wavelength working range $\lambda_{range1}$ having a first start wavelength $\lambda_{start1}$ and a first end wavelength $\lambda_{end1}$. The second laser source 113 is configured to emit light at a second wavelength working range $\lambda_{range2}$ having a second start wavelength $\lambda_{start2}$ and a second end wavelength $\lambda_{end2}$. The third laser source 114 is configured to emit light at a third wavelength range $\lambda_{range3}$ having a third start wavelength $\lambda_{start3}$ and a third end wavelength $\lambda_{end3}$. The first end wavelength $\lambda_{end1}$ may be larger than the second start wavelength $\lambda_{start2}$ and the second end wavelength $\lambda_{end2}$ may be larger than the third start wavelength $\lambda_{start3}$, such that there is an overlap between (1) the first wavelength working range $\lambda_{range1}$ and the second wavelength working range $\lambda_{range2}$ and (2) the second wavelength working range $\lambda_{range2}$ and the third wavelength working range $\lambda_{range3}$ as depicted in FIG. 7A.

With further reference to FIGS. 7A-7E, the first wavelength blocking component 116, the second wavelength blocking component 120, the third wavelength blocking component 117, the fourth wavelength blocking component 122, the fifth wavelength blocking component 118, and the sixth wavelength blocking component 124 are configured to reflect light at a first wavelength blocking range $\lambda_{B1}$, a second wavelength blocking range $\lambda_{B2}$, a third wavelength blocking range $\lambda_{B3}$, a fourth wavelength blocking range $\lambda_{B4}$, a fifth wavelength blocking range $\lambda_{B5}$, and a sixth wavelength blocking range $\lambda_{B6}$ respectively. The first wavelength blocking range $\lambda_{B1}$ may include the first start wavelength $\lambda_{start1}$. The second wavelength blocking range $\lambda_{B2}$ may include the first end wavelength $\lambda_{end1}$. The third wavelength blocking range $\lambda_{B3}$ may include the second start wavelength $\lambda_{start2}$. The fourth wavelength blocking range $\lambda_{B4}$ may include the second end wavelength $\lambda_{end2}$. The fifth wavelength blocking range $\lambda_{B5}$ may include the third start wavelength $\lambda_{start3}$. The sixth wavelength blocking range $\lambda_{B6}$ may include the third end wavelength $\lambda_{end3}$. The wavelengths of the first wavelength blocking range $\lambda_{B1}$ may be smaller than the wavelengths of the second wavelength blocking range $\lambda_{B2}$ and the wavelengths of the third wavelength blocking range $\lambda_{B3}$ may be smaller than the wavelengths of the second wavelength blocking range $\lambda_{B2}$. The first wavelength blocking range $\lambda_{B1}$ and the second wavelength blocking range $\lambda_{B2}$ may be contiguous and the second wavelength blocking range $\lambda_{B2}$ and the third wavelength blocking range $\lambda_{B3}$ may be contiguous.

With reference to FIGS. 7A-7E, generation of a multi-laser swept signal is depicted. The top of each of FIGS. 7A-7E demonstrates the transmission of the range blocking components at different wavelengths. The sharp decrease in transmission of the wavelength blocking components represent the wavelength blocking wavelengths of the different wavelength blocking components. The bottom of each of FIGS. 7A-7E represent the wavelength of the output $\lambda_1$, $\lambda_3$, $\lambda_3$ of each laser source 112, 113, 114. Generation of the multi-laser swept signal may be accomplished according to the steps outlined in FIG. 4 or 5.

Figure 7B:
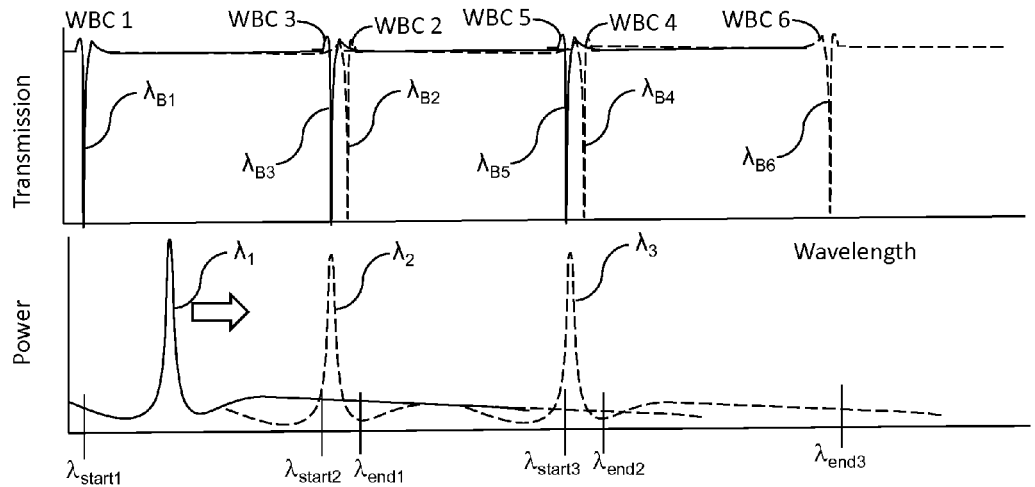

In FIG. 7A, each of the first laser source 112, the second laser source 113, and the third laser source 114 are parked at their respective end wavelengths $\lambda_{end1}$, $\lambda_{end2}$, $\lambda_{end3}$. In FIG. 7B, the first laser source 112 is swept from the first start wavelength $\lambda_{start1}$ to the first end wavelength $\lambda_{end1}$, while the second laser source 113 and the third laser source 114 are parked at the second start wavelength $\lambda_{start2}$ and third start wavelength $\lambda_{start3}$ respectively. The output of the second laser source 113 and third laser source 114 are blocked by the third wavelength blocking component 117 and fifth wavelength blocking component 118 respectively such that the output of the system 100 is approximately equal to the output of the first laser source 112.

Figure 7C:
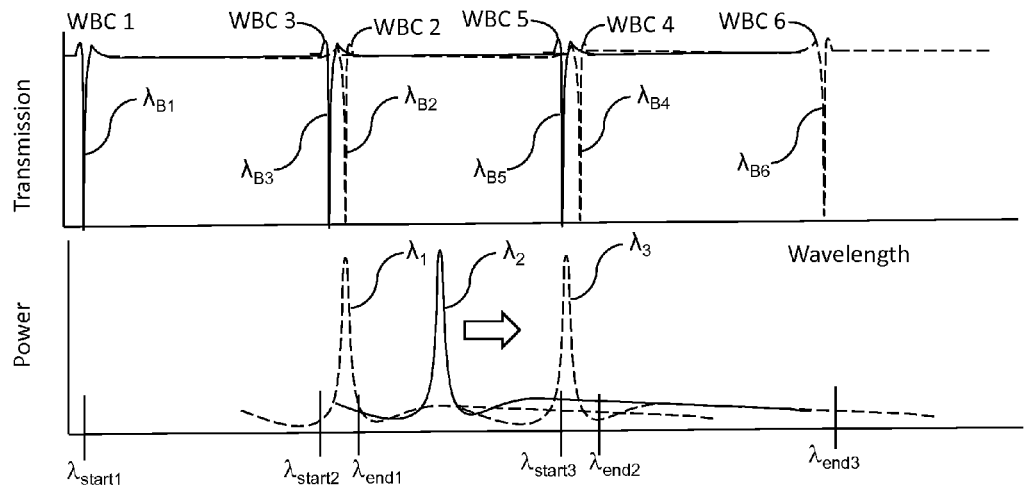

In FIG. 7C, as the first laser source 112 reaches the first end wavelength $\lambda_{end1}$, the output of the first laser source 112 is blocked by the second wavelength blocking component 120 and the second laser source 113 is swept from the second start wavelength $\lambda_{start2}$ along its wavelength working range $\lambda_{range2}$ such that the output of the second laser source 113 is no longer blocked by the third wavelength blocking component 117. As the second laser source 113 is swept along the second working range $\lambda_{range2}$, the output of the first laser source 112 and third laser source 114 are blocked by the second wavelength blocking component 120 and fifth wavelength blocking component 118 respectively such that the output of the system 100 is approximately equal to the output of the second laser source 113.

Figure 7D:
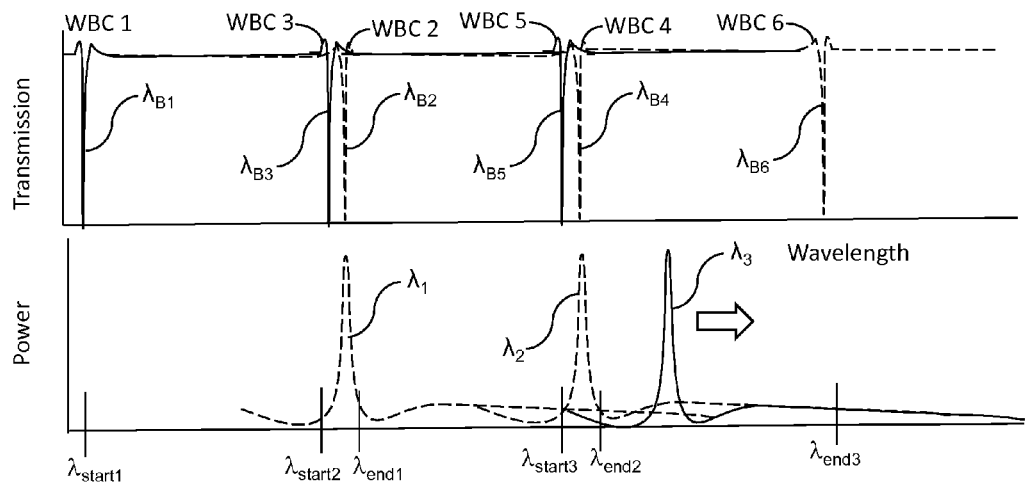

In FIG. 7D, as the second laser source 113 reaches the second end wavelength $\lambda_{end2}$, the output of the second laser source 113 is blocked by the fourth wavelength blocking component 122 and the third laser source 114 is swept from the third start wavelength $\lambda_{start3}$ along its wavelength working range $\lambda_{range3}$ such that the output of the third laser source 114 is no longer blocked by the fifth wavelength blocking component 118. As the third laser source 114 is swept along the third working range $\lambda_{range3}$, the output of the first laser source 112 and second laser source 113 are blocked by the second wavelength blocking component 120 and fourth wavelength blocking component 122 respectively such that the output of the system 100 is approximately equal to the output of the third laser source 114.

Figure 7E:
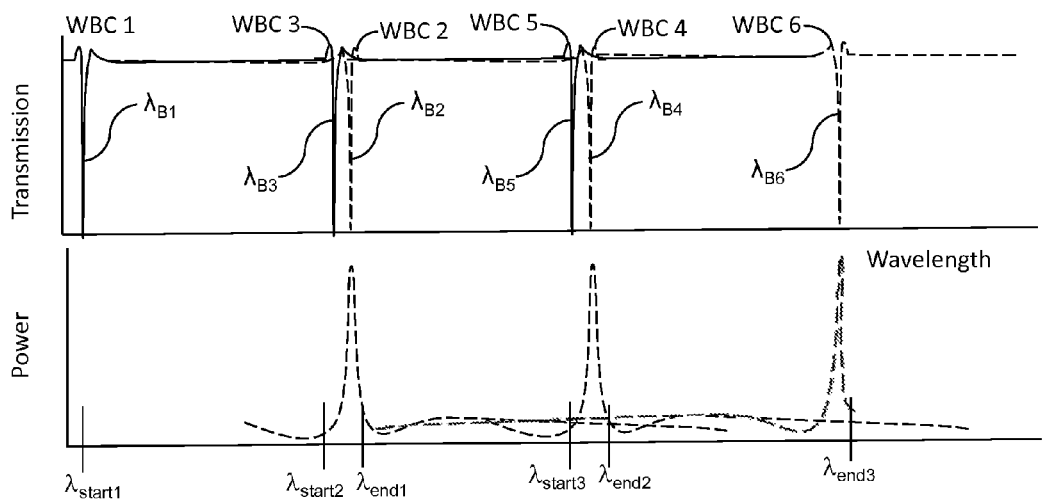

In FIG. 7E, the third laser source 114 reaches the third end wavelength $\lambda_{end3}$, and the output of the third laser source 114 is blocked by the sixth wavelength blocking component 124. The output of the first laser source 112, second laser source 113, and third laser source 114 are blocked by the second wavelength blocking component 120, fourth wavelength blocking component 122, and sixth wavelength blocking component 124 respectively such that there is approximately no output from the system 100.

Illustrative embodiments of an invention are disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means". It should also be noted that although the specification lists method steps occurring in a particular order, these steps may be executed in any order, or at the same time.

Although the invention is shown and described with respect to illustrative embodiments, it is evident that equivalents and modifications will occur to those persons skilled in the art upon the reading and understanding hereof. The present invention includes all such equivalents and modifications and is limited only by the scope of the claims if appended hereto.

What is claimed is:

1. A tunable swept multi-laser system, the system comprising:
   a first tunable laser source having a first wavelength working range wherein the first wavelength working range begins at a first start wavelength and ends at a first end wavelength, wherein the first tunable laser source is configured to output light having a first wavelength within the first wavelength working range,
   a second tunable laser source having a second wavelength working range wherein the second wavelength working range begins at a second start wavelength and ends at a second end wavelength, wherein the second tunable laser source is configured to output light having a second wavelength within the second wavelength working range,
   a first wavelength blocking component having a first wavelength blocking range, wherein the first wavelength blocking component is optically coupled with the first tunable laser source, the first wavelength blocking range including the first end wavelength,
   a second wavelength blocking component having a second wavelength blocking range, wherein the second wavelength blocking component is optically coupled with the second tunable laser source, the second wavelength blocking range including the second start wavelength, wherein there is an overlap between the first wavelength working range and the second wavelength working range, and
   a controller configured to:
      set and hold the output wavelength of the second tunable laser source to the second start wavelength while the second tunable laser source remains on,
      control the output wavelength of the first tunable laser source such that the output of the first tunable laser source is swept from the first start wavelength to the first end wavelength,
      hold the output wavelength of the first tunable laser source to the first end wavelength while the first tunable laser source remains on, and
      control the output wavelength of the second tunable laser source such that the output of the second tunable laser source is swept from the second start wavelength to the second end wavelength.

2. The tunable swept multi-laser system of claim 1, further comprising a coupler having a first optical input, a second optical input, and an optical output, wherein the first optical input is coupled with the first tunable laser source, the second optical input is coupled with the second tunable laser source, and the optical output is configured to emit the combined output of the first tunable laser source and the second tunable laser source.

3. The tunable swept multi-laser system of claim 1, wherein the first start wavelength is smaller than the second start wavelength and the first end wavelength is smaller than the second end wavelength.

4. The tunable swept multi-laser system of claim 1, wherein the first wavelength blocking range and the second wavelength blocking range are approximately contiguous.

5. The tunable swept multi-laser system of claim 1, the system further comprising:
   a start wavelength blocking component optically coupled with the first tunable laser source and having a starting blocking range, the start wavelength blocking range including the first start wavelength, and
   an ending wavelength blocking component optically coupled with the second tunable laser source and having an ending wavelength blocking range, the ending wavelength blocking range including the second end wavelength.

6. The tunable swept multi-laser system of claim 1, wherein the first tunable laser source and the second tunable laser source are Semiconductor Monolithic Tunable Laser sources.

7. The tunable swept multi-laser system of claim 1, wherein the first wavelength blocking component and the second wavelength blocking component are Fiber Bragg Gratings.

8. The tunable swept multi-laser system of claim 1, the controller further configured to:
   control the output wavelength of the first and second tunable laser source, wherein the controller directs both the first and second tunable laser source to output light having an output wavelength approximately equal to a specified wavelength;
   the first tunable laser source configured such that, when it is directed to output the specified wavelength, the output wavelength of the first tunable laser source output is approximately equal to:
      the first start wavelength when the specified wavelength is less than the first start wavelength;
      the first end wavelength when the specified wavelength is greater than the first end wavelength; and
      the specified wavelength when the specified wavelength is within the first wavelength working range;
   the second tunable laser source configured such that, when it is directed to output the specified wavelength, the output wavelength of the second tunable laser source output is approximately equal to:
      the second start wavelength when the specified wavelength is less than the second start wavelength;
      the second end wavelength when the specified wavelength is greater than the second end wavelength;
      the specified wavelength when the specified wavelength is within the second wavelength working range.

9. The tunable swept multi-laser system of claim 8, wherein the controller sweeps the specified wavelength from the first start wavelength to the second end wavelength.

10. The tunable swept multi-laser system of claim 1, the controller further configured to control the light output by the first tunable laser source and the second tunable laser source to generate a multi-laser swept signal, wherein:

the first and/or second tunable laser source outputs light having a wavelength approximately equal to a directed wavelength at each time point in the multi-laser swept signal to generate the multi-laser swept signal;

the controller sweeps a specified wavelength from the first start wavelength to the second end wavelength to generate the multi-laser swept signal, such that:

when the specified wavelength is within the first wavelength working range, the controller directs the first tunable laser source to output light having an output wavelength approximately equal to the specified wavelength;

when the specified wavelength is within the second wavelength working range, the controller directs the second tunable laser source to output light having an output wavelength approximately equal to the specified wavelength;

when the specified wavelength is less than the first start wavelength, the controller directs the first tunable laser source to output light having an output wavelength approximately equal to the first start wavelength;

when the specified wavelength is greater than the first end wavelength, the controller directs the first tunable laser source to output light having an output wavelength approximately equal to the first end wavelength;

when the specified wavelength is less than the second start wavelength, the controller directs the second tunable laser source to output light having an output wavelength approximately equal to the second start wavelength;

when the specified wavelength is greater than the second end wavelength, the controller directs the second tunable laser source to output light having an output wavelength approximately equal to the second end wavelength.

11. A tunable swept multi-laser system, the system comprising:

multiple tunable laser sources including a first tunable laser source, a last tunable laser source, and other tunable laser sources, each tunable laser source of the multiple tunable laser sources having a wavelength working range, the wavelength working range beginning at a start wavelength and ending at an end wavelength, wherein each tunable laser source outputs light having a wavelength in the wavelength working range, multiple wavelength blocking components including a first wavelength blocking component and a last wavelength blocking component, each wavelength blocking component optically coupled to an associated tunable laser source and having a wavelength blocking range, the first tunable laser source optically coupled to the first wavelength blocking component, wherein the wavelength blocking range of the first wavelength blocking component includes the end wavelength of the first tunable laser source, the last tunable laser source optically coupled to the last wavelength blocking component, wherein the wavelength blocking range of the last wavelength blocking component includes the start wavelength of the last tunable laser source, each of the other tunable laser sources optically coupled to and associated with two wavelength blocking components, each two wavelength blocking components including a start wavelength blocking component and an ending wavelength blocking component, each start wavelength blocking component having a wavelength blocking range including the start wavelength of the associated laser source, each ending wavelength blocking component having a wavelength blocking range including the end wavelength of the associated laser source, the wavelength working range of the first laser source overlapping the wavelength working range of one of the multiple laser sources, the wavelength working range of the last laser source overlapping the wavelength working range of one of the multiple laser sources, the wavelength working range of each of the other laser sources overlapping the wavelength working range of two of the multiple laser sources, and a controller configured to:

for each of the other tunable laser sources, set and hold the output wavelength of the other tunable laser source to the start wavelength of the other tunable laser source while the other tunable laser source remains on, set and hold the output wavelength of the last tunable laser source to the start wavelength of the last tunable laser source while the last tunable laser source remains on, control the output wavelength of the first tunable laser source such that the output of the first tunable laser source is swept from the start wavelength to the end wavelength of the first tunable laser source, hold the output wavelength of the first tunable laser source to the end wavelength of the first tunable laser source, for each of the other tunable laser sources:

control the output wavelength of the other tunable laser source such that the output of the other tunable laser source is swept from the start wavelength to the end wavelength of the other tunable laser source, hold the output wavelength of the other tunable laser source to the end wavelength of the other tunable laser source, and control the output wavelength of the last tunable laser source such that the output of the last tunable laser source is swept from the start wavelength to the end wavelength of the last tunable laser source.

12. The tunable swept multi-laser system of claim 11, further comprising a coupler having multiple optical inputs and an optical output, wherein the optical inputs are configured to optically couple with the multiple tunable laser sources and the optical output is configured to emit the combined output of the multiple tunable laser sources.

13. The tunable swept multi-laser system of claim 12, wherein the coupler comprises multiple couplers optically coupled to one another.

14. The tunable swept multi-laser system of claim 11, wherein the wavelength working ranges of the multiple tunable laser sources overlap to form a combined wavelength working range having a combined start wavelength and a combined end wavelength.

15. The tunable swept multi-laser system of claim 11, wherein the wavelength blocking range of two of the wavelength blocking components are encompassed by each overlap of the wavelength working ranges of the multiple tunable laser sources.

16. The tunable swept multi-laser system of claim 15, wherein the wavelength blocking range of the two of the wavelength blocking component encompassed by each overlap of the wavelength working range are approximately contiguous.

17. The tunable swept multi-laser system as of claim 11, wherein the multiple tunable laser sources are Semiconductor Monolithic Tunable Laser sources.

18. The tunable swept multi-laser system as of claim 11, wherein the wavelength blocking components are Fiber Bragg Gratings.

19. A method for blocking, in a tunable swept multi-laser system including multiple tunable laser sources wherein each tunable laser of the multiple tunable laser sources is associated with at least one wavelength blocking component and each wavelength blocking component has a wavelength blocking range, the output of at least one tunable laser source using the at least one associated wavelength blocking component to control the output of the tunable swept multi-laser system, wherein each tunable laser source of the multiple tunable laser sources has a wavelength working range defined by a start wavelength and an end wavelength and each tunable laser source outputs light having a wavelength within the wavelength working range, the method comprising:

selecting a desired tunable laser source from the multiple tunable laser sources and setting the other tunable laser sources of the multiple tunable laser sources as undesired tunable laser sources;

tuning each undesired tunable laser source to its start wavelength while each undesired tunable laser source remains on;

sweeping the desired tunable laser source across its working range;

parking the desired tunable laser source at its end wavelength;

setting the desired tunable laser source as a previously desired tunable laser source;

repeatedly setting one of the undesired tunable laser sources as the desired tunable laser source, sweeping the desired laser source across its working range parking the desired tunable laser source at its end wavelength, and setting the desired tunable laser source as a previously desired tunable laser source until there are no remaining undesired tunable laser sources.

20. The method of claim 19, wherein a laser order specifying an order of the tunable laser sources is received prior to selecting the desired tunable laser source and tunable laser sources are selected as the desired tunable laser source in the order specified in the laser order.

21. The method of claim 19, wherein a laser order specifying an order of the tunable laser sources is determined prior to selecting the tunable desired laser source and tunable laser sources are selected as the desired tunable laser source in the order specified in the laser order.

22. The method of claim 21, wherein the laser order is determined such that the tunable laser sources are ordered by start wavelength from the lowest start wavelength to the highest start wavelength.

23. A method for blocking, in a tunable swept multi-laser system including multiple tunable laser sources wherein each tunable laser of the multiple tunable laser sources is associated with at least one wavelength blocking component and each wavelength blocking component has a wavelength blocking range, the output of at least one tunable laser source using the at least one associated wavelength blocking component to control the output of the tunable swept multi-laser system, wherein each tunable laser source of the multiple tunable laser sources has a wavelength working range defined by a start wavelength and an end wavelength, the method comprising:

setting and holding the output wavelength of a second tunable laser source of the multiple tunable laser sources to the start wavelength of the second tunable laser source while the second tunable laser source remains on, wherein the wavelength blocking range of at least one of the at least one wavelength blocking component associated with the second tunable laser source includes the start wavelength of the second tunable laser, controlling the output wavelength of a first tunable laser source of the multiple tunable laser sources such that the output of the first tunable laser source is swept from the start wavelength to the end wavelength of the first tunable laser, holding the output wavelength of the first tunable laser source to the end wavelength of the first tunable laser while the first tunable laser source remains on, wherein the wavelength blocking range of at least one of the at least one wavelength blocking component associated with the first tunable laser source includes the end wavelength of the first tunable laser, and controlling the output wavelength of the second tunable laser source such that the output of the second tunable laser source is swept from the start wavelength to the second end wavelength of the second tunable laser.

24. A controller for performing the method of claim 19.

* * * * *